United States Patent [19]
Mermagen et al.

[11] Patent Number: 5,530,552
[45] Date of Patent: Jun. 25, 1996

[54] DOUBLE SIDED WAFER, ALIGNMENT TECHNIQUE

[75] Inventors: Timothy Mermagen, Havre de Grace; Bruce R. Geil, Baltimore, both of Md.

[73] Assignee: The United States of America as represented by the Secretary of the Army, Washington, D.C.

[21] Appl. No.: 365,275

[22] Filed: Dec. 28, 1994

Related U.S. Application Data

[63] Continuation-in-part of Ser. No. 988,306, Dec. 9, 1992, abandoned.

[51] Int. Cl.$^6$ .................................................. G01B 11/00
[52] U.S. Cl. ................................................................ 356/401
[58] Field of Search ................................... 356/399, 400, 356/401

[56] References Cited

U.S. PATENT DOCUMENTS 4,393,131  7/1983  Whalin et al. ............................ 430/320

Primary Examiner—F. L. Evans
Attorney, Agent, or Firm—Freda L. Krosnick; Muzio B. Roberto

[57] ABSTRACT

A photolithographed method and pattern for alignment of circuit patterns on a double sided opaque substrate or semiconductor such as a silicon wafer during processing of integrated circuits.

9 Claims, 4 Drawing Sheets

DOUBLE SIDED WAFER, ALIGNMENT TECHNIQUE

RIGHTS OF THE GOVERNMENT

The invention described herein may be manufactured, used, and licensed by or for United States Governmental purposes without payment to us of any royalty thereon.

This application is a continuation-in part of application Ser. No. 07/988,306, filed Dec. 9, 1992, now abandoned.

BACKGROUND OF THE INVENTION

1. Field of the Invention

The present invention relates to a method for alignment of circuit patterns on a double sided opaque substrate or semiconductor, such as a silicon wafer, during the processing of integrated circuits. More particularly, the invention relates to a photolithographical method for alignment of patterns from the front side to the back side of the substrate or semiconductor wafer.

2. Description of the Prior Art
a. Background

Presently, most integrated circuits are produced using silicon wafers which are polished on only one side. However, there are specific applications which require the use of photolithography on the front and back of the substrate. There are methods available that will align the patterns on both sides of the substrate using an infrared light to see through the substrate. Another method for double sided alignment requires the use of a fixture which holds two masks in alignment with each other. The substrate is placed between two masks and imaged. These methods require specially developed equipment to do the alignment. Because this equipment is expensive, most facilities cannot justify the cost.

Front-to-back substrate alignment is a problem for the industry because of the cost and limited availability of the specialized equipment that is needed to easily perform this task. The user of an optical contact printer cannot see through the substrate to align the pattern on the front of the substrate to that on the back.

In optical contact printing, therefore, problems with substrate rotation and displacement arise when the front and back patterns must be aligned.

b. Specific Prior Art

U.S. Pat. No. 3,937,579 to Schmidt discloses a complete apparatus for the alignment of both sides of the wafer. The apparatus is similar to present contact mask aligners but provides for the insertion of two masks in a specially designed mask aligner with the wafer sandwiched between them. The two masks are then aligned to each other and the wafer.

U.S. Pat. No. 4,189,820 to Slack discloses a method where two masks and a wafer are sandwiched together and held. This sandwich is then exposed on both sides.

U.S. Pat. No. 4,323,327 to Slack discloses the use of a pivoting mechanism for the alignment of two masks to the wafer.

U.S. Pat. No. 4,534,804 to Cade describes the use of a laser beam to create a defect inside of the substrate. When the substrate is heated the mark moves from the inside of the substrate to the outside thus creating an alignment mark.

3. Advantages Over the Prior Art

The above prior art requires that the wafer either be sandwiched and aligned to the two masks or that special equipment be used to accomplish the alignment. The present method does not require special equipment. It allows a standard mask aligner to align a standard photomask with special alignment marks by windows and guides and facilitates alignment for both sides of the substrate in a simplified and easily performed manner. A window is an area where the chrome surface of the photomask is removed leaving the glass substrate uncovered. These alignment marks are placed on the first mask that is used. This mask can also have other pattern data on it so that an extra alignment mask is not required.

To solve these problems, mask alignment methods have been designed in the Semiconductor Engineering and Materials Technology (SEMT) Facility of the Army Research Laboratory (ARL)←. The present invention discloses the results of two projects conducted at ARL which projects required accurately aligned photolithography on both sides of double-polished silicon substrates. The first project involved development of a fabrication method for a semiconductor chip for an in-house research program. This method is termed the lower alignment accuracy method. This method was successfully used to produce over 4000 test chips. The second project involved development of a fabrication method in which floating cantilever beams were used as accelerometer switches. This method is termed the higher alignment accuracy method. Several hundred cantilever accelerometers were produced using this method. These methods allow the user to contact print quickly with a front-to-back alignment accuracy of better than 50 microns without the use of expensive through-the-substrate alignment equipment. For limited use, the methods developed in the SEMT laboratory enable double sided-pattern alignment using standard single sided imaging equipment.

The present invention provides a double sided substrate alignment method using a minimum of standard imaging equipment as oppose to the prior arts use of expensive specially developed equipment to perform the double sided alignment. A front-to-back substrate alignment accuracy of better than 25 microns is achieved with applicants higher alignment accuracy method using a standard optical contact printer.

SUMMARY OF THE INVENTION

It is a primary object of the present invention to provide a method for alignment of circuit patterns on a double sided opaque substrate.

It is another primary object of the invention to provide a photolithographical method alignment of patterns from the front side to the back side of the substrate.

These objects and others not specifically enumerated are accomplished using the method of the present invention for alignment of circuit patterns from the front side to the back side of the substrate. The method allows a standard mask aligner to align a standard photomask with special alignment marks by windows and guides in a simplified and easily performed manner. The method allows the user to contact print quickly without the use of expensive through-the-substrate alignment equipment.

BRIEF DESCRIPTION OF THE INVENTION

The foregoing and other objects, aspects, uses, and advantages of the present invention will be more fully appreciated as the same becomes better understood when considered in connection with the following accompanying drawings, in which.

DESCRIPTION OF THE PREFERRED EMBODIMENT

Figure 1:
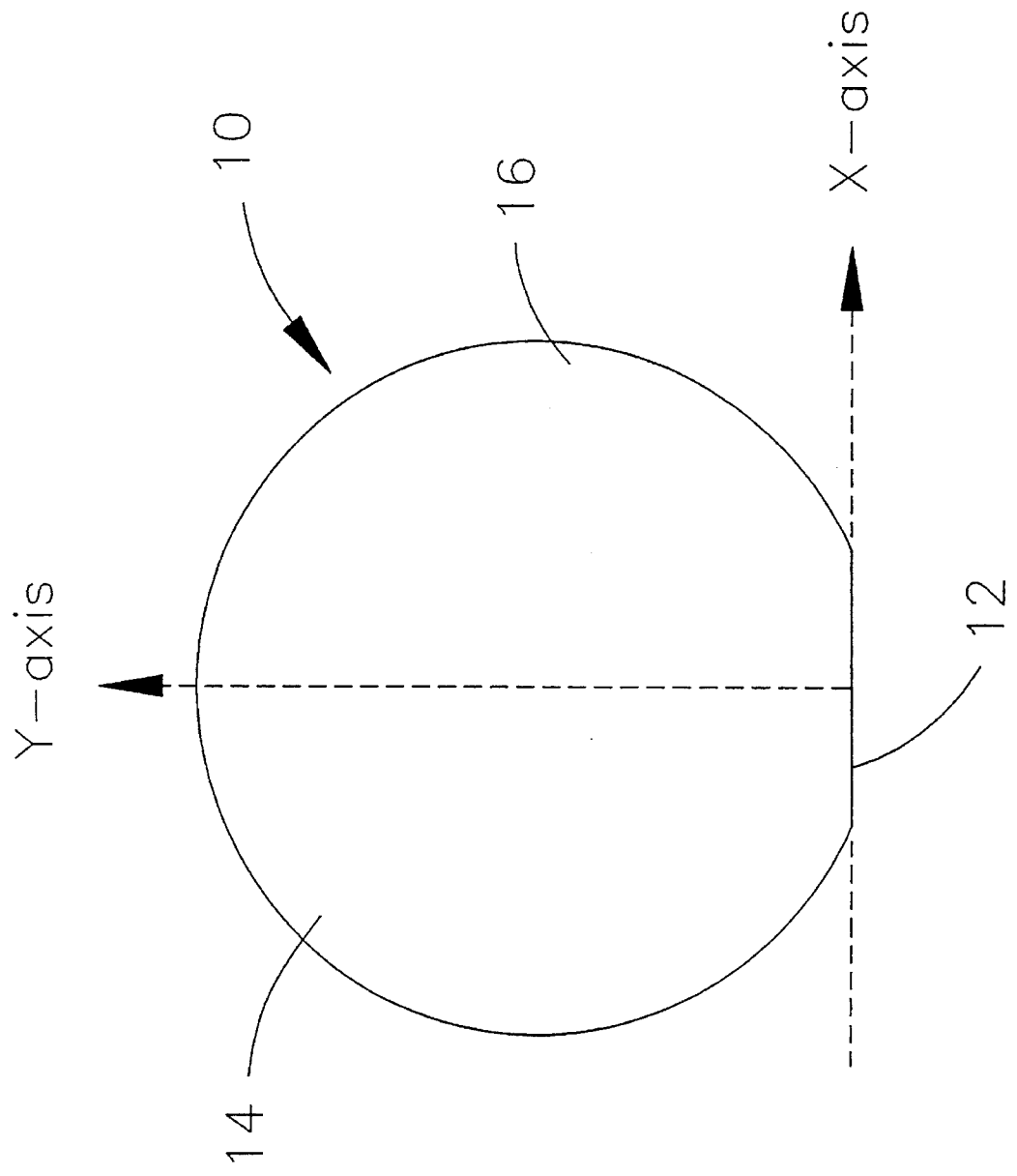
FIG. 1 is a perspective top view of an opaque substrate having a flat bottom edge.

Referring now to the drawings, like reference numerals represent identical or corresponding parts throughout the views.

The present invention pertains to a photolithographically method for use in the semiconductor processing art for alignment of circuit patterns from the front side to the back side of an opaque substrate or semiconductor plate. The method may be used for any size substrate that a standard mask aligner can handle. Substrates presently used for integrated circuit manufacture are circular in shape and designate the orientation of the crystal structure with a flat edge portion.

FIG. 1 shows a circular-shaped substrate plate 10 having a small segment eliminated between a small arc and a chord in the lower portion of the substrate 10. This flatten edge portion is referred in the art as a flat and is labelled with the number 12. For purpose of describing the invention, the flat 12 constitutes an X-axis for the substrate 10, and the front and back sides of the substrate 10 are arbitrarily divided into a left section 14 and a right section 16 with the dividing line forming a Y-axis which is perpendicular to the X-axis.

Figure 2:
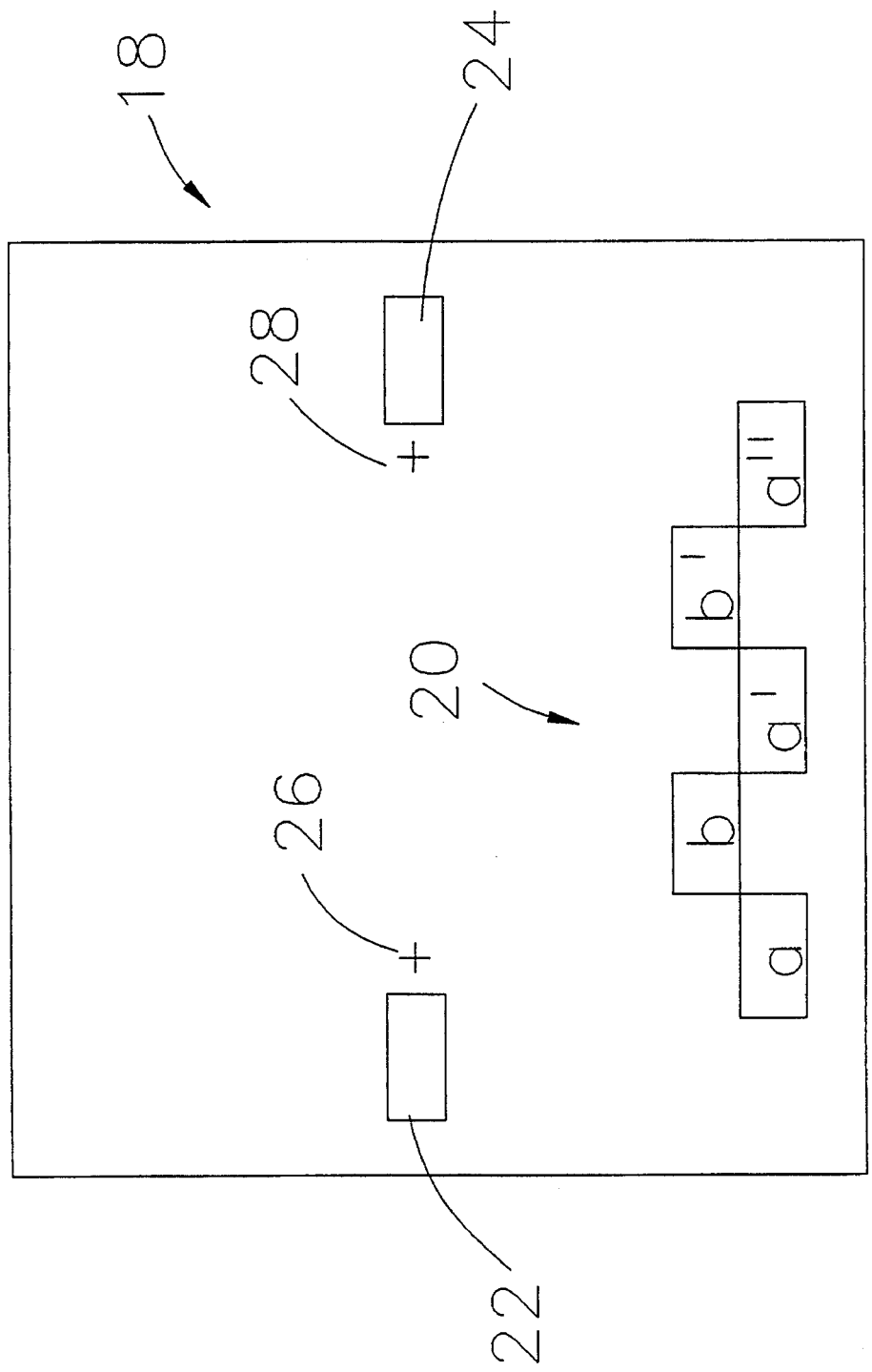
FIG. 2 is a perspective top view of a mask having left and right alignment windows and a rotational alignment guide.

FIG. 2 shows a mask 18 which is prepared using standard practices of photosynthesizing and exposing through a transparency to prepare alignment configurations on the mask 18.

The alignment configuration consists of a series of left and right rectangular-shaped windows 22, 24, and left right crossbars 26, 28. Guides 20 a, a', a", and b, b' are arranged in a staggered manner on each side of a horizontal line. The line is parallel to the bottom edge of the mask 18 and constitutes an X-axis.

Guides 20 are referred to herein as the rotational alignment guide. The left and right windows 22, 24 are located near the left and right edges, respectively, of mask 18. The left and right crossbars 26, 28 are located on the inner sides of the windows 22, 24. The crossbars 26, 28 are used to align other photomasks to substrate 10.

Figure 3:
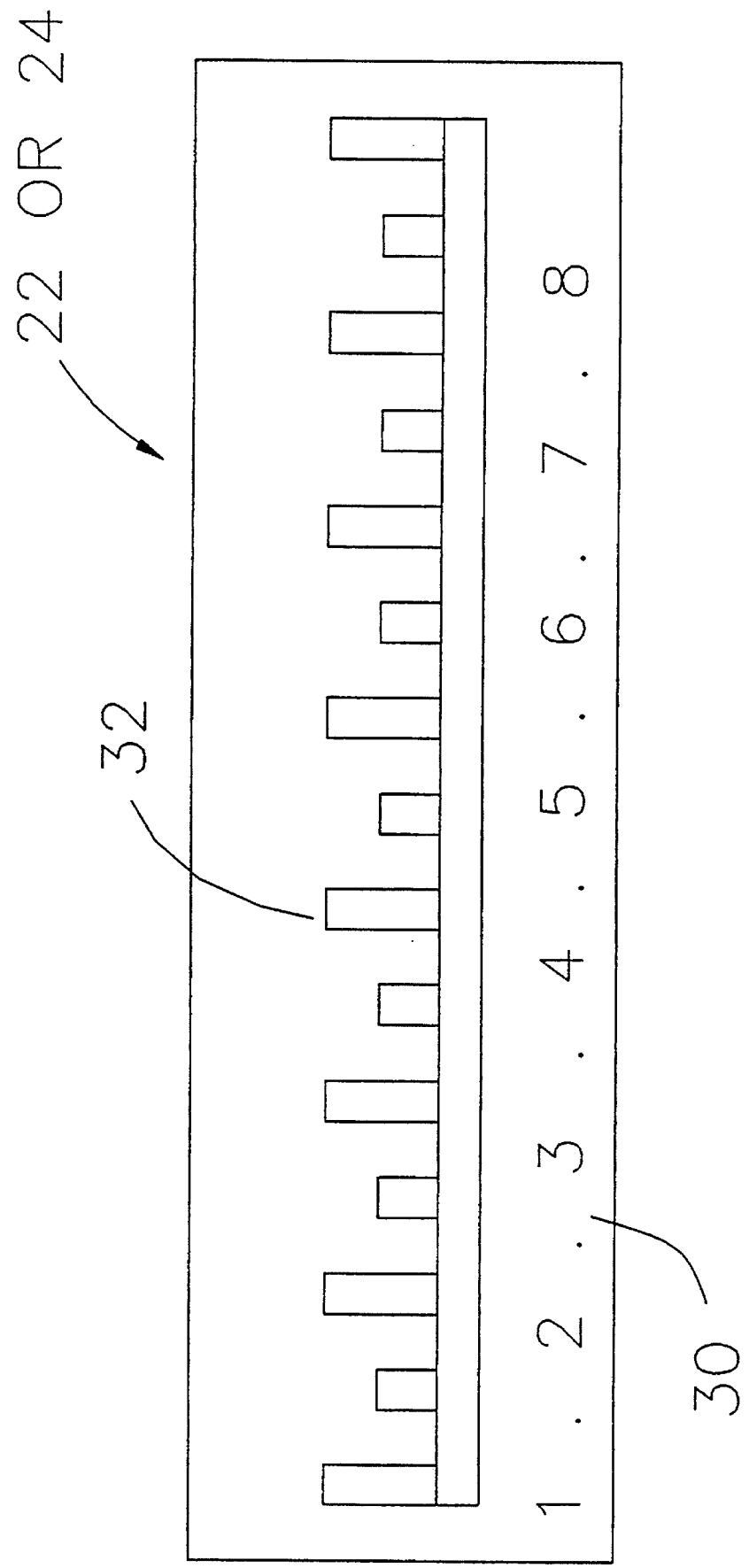
FIG. 3 is an enlarged view of either the left or right alignment window showing the alignment gradient.

FIG. 3 shows a gradient numeral array 30 arranged along the bottom edge of the window 22 or 24. The gradient array 30 numbers from one to eight which numbering system is arbitrarily selected. The window 22 or 24 also includes an alignment gradient unit 32 which constitutes a scale for the numbers.

Figure 4:
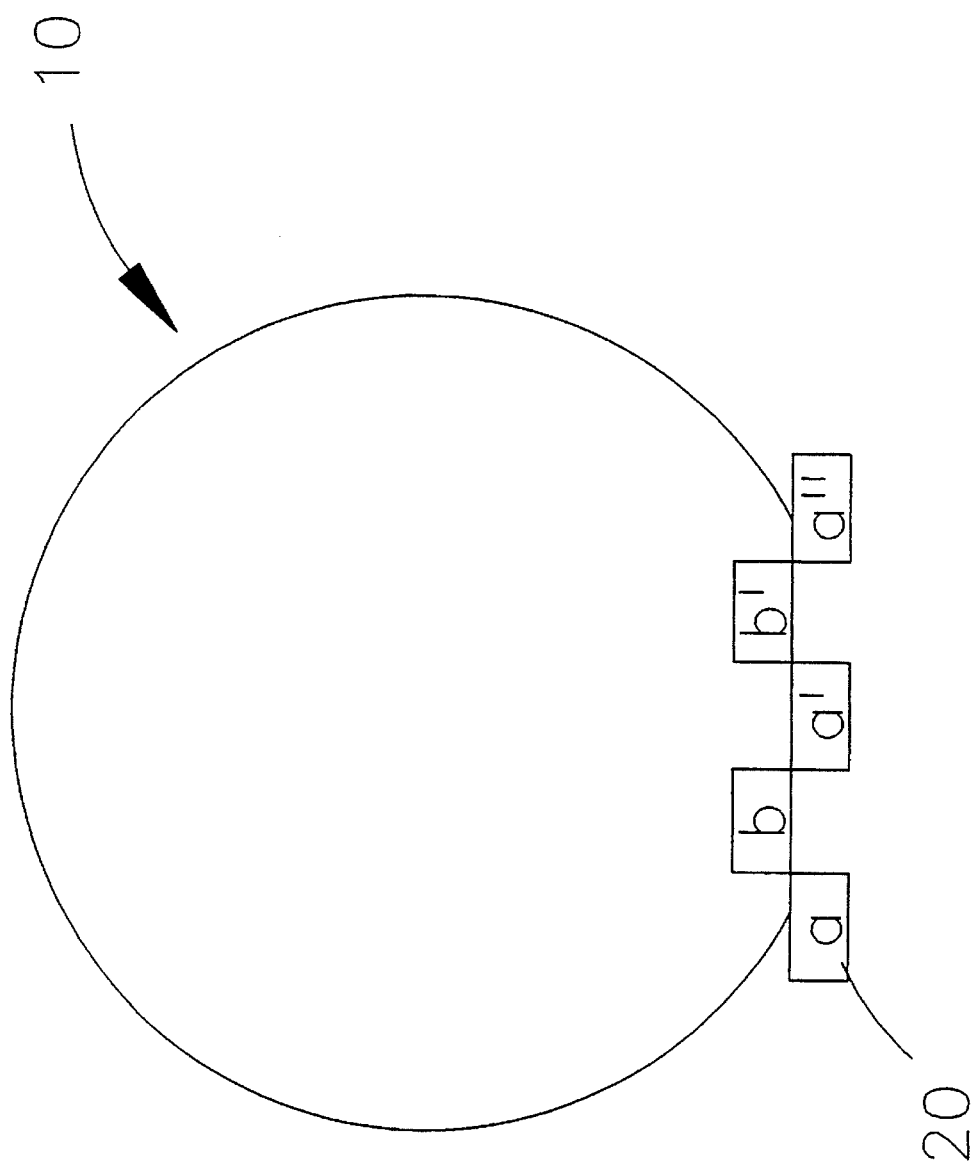
FIG. 4 is another view of the substrate of FIG. 1 showing the alignment of its flat bottom edge with the rotational alignment guide.

FIG. 1 shows the front side of the substrate 10. The back side is not shown, but is similar in structure and function to front side. The initial method step for aligning the circuit patterns on the front side of the substrate 10 with the patterns on its back side is to place or install the substrate 10 and the mask 18 into the alignment system; that is, conventional equipment for clamping and the like are utilized wherein the method is to be practiced. Once in the system, the mask's rotational alignment guide 20 in the form of a line element is superimposed over the area of the flat 12 of the substrate 10. By trial and error the user aligns the line element of the guide 20 with the flat 12. The flat 12 in its state of alignment will intersect the points on the guide 20, as shown in FIG. 4. Once the flat 12 is aligned, the user moves the substrate 10 in the X-axis direction while viewing either the edge of left section 22 or the edge of right section 24. Assume for this description that the edge of the left section 22 is selected. The end alignment result is the same regardless of which edge is selected. The user passes the substrate 10 through the area of the left window 22 of the mask 18. The user brings the left edge of wafer 10 in view through window 22. The user observes the numbers on the gradient numeral 30, selects and records a value, that is, a number which is selected on an arbitrary basis. This completes the alignment on the front side of the substrate 10.

The user then flips or turns over the substrate 10 over to the back side. The same alignment steps that were performed on the front side are performed on the back side. That is, the substrate flat is aligned to the rotational alignment guide (see FIG. 4). The opposite edge of the substrate is aligned through the same value that was used for the front side. This completes the alignment on the back side of the substrate 10. Thereby circuit patterns on the front side of the substrate 10 are aligned with patterns on the back side.

To those skilled in the art, many modifications and variations of the present invention are possible in light of the above teaching. In the SEMT laboratory experiments, the user aligned the flat to the rotational guide which consists of three 500 micron bar (a,a',a") separated by two 1000 micron wide alignment windows (b,b').

Further, the gradient on the mask can be as small as is required to obtain good alignment accuracy with the alignment system being used. The rotational alignment guide should be on the substrate radius from the center of the mask as the alignment grating center. The alignment crossbars can be positioned anywhere on the mask, but on future alignment levels these marks must be in the same place in relation to the patterns on the first level. Accordingly, it is therefore to be understood that the present invention may be practiced otherwise than as specifically described herein and still will be within the spirit and scope of the appended claims.

Having described our invention, we claim

1. A method for aligning circuit patterns on one side of s substrate with patterns on the other side, comprising in combination the following steps:

providing a circular shaped substrate, the circular substrate having a small segment eliminated at the bottom thereof between a small arc, and chord, and the chord constituting an x-axis and a flat edge element, the substrate being divided into left and right sections with a dividing line between sections forming a y-axis perpendicular to the x-axis, providing a mask having windows with view boxes comprising alignment character gradients in the left and right sections of the mask, and an arrangement of an elongated rotational alignment guide and two alignment character gradient located above the guide, applying the mask to the substrate with the flat edge of the substrate aligned with the rotational alignment guide, arbitrary selecting a number from an alignment character gradients in the left section of the mask, and moving the substrate in the x-axis direction on the mask, whereby user views a selected alignment character gradient in the left view box, and thereby completes the alignment on one side and exposing the substrate, turning the substrate over to the other side and performing the same alignment for the flat edge element, using the number for alignment of the right window thereby completing the alignment on the other side, and exposing the other side.

2. A method in accordance with claim 1, wherein the elongated rotational alignment guide comprises a 500 micron bar separating two 1,000 micron bars.

3. A method in accordance with claim 1, wherein the rotational alignment guide is 3500 micron wide.

4. A system for aligning circuit patterns on a double sided opaque substrate comprising the following:

a circular substrate having a small segment eliminated between the arc and chord at the bottom of thereof, the substrate forming a flat edge and X-axis at said bottom, the substrate divided in to left and right sections with a dividing line between the sections forming Y-axis perpendicular to the X-axis, a mask suitable contoured to be compatible with the substrate comprising, windows with view boxes in each of the left and right sections of the mask, an arrangement of an elongated rotational alignment guide, and two alignment character gradients located above the guide, whereupon, the mask is aligned with the substrate, and the substrate is exposed.

5. A system as defined in claim 4, wherein the mask is aligned with the back side of the substrate, and the mask is exposed.

6. A system as defined in claim 5 wherein the material of the substrate is a semiconductor.

7. A system as defined in claim 6 wherein the substrate is silicon.

8. A system as defined in claim 6 wherein the guide contains three 500 wide micron wide bars for aligning the flat edge element.

9. A system as defined in claim 4 wherein the mask comprises cross bars as to be compatible with future masks.

* * * * *